(12) United States Patent  
Hsu et al.

(10) Patent No.: US 9,605,337 B2  
(45) Date of Patent: Mar. 28, 2017

(54) SUBSTRATE STRUCTURE AND FABRICATION METHOD THEREOF

(71) Applicant: TPK Touch Solutions (Xiamen) Inc., Xiamen (CN)

(72) Inventors: I-Chung Hsu, Taipei (TW); Kuo-Shu Hsu, Xinbei (TW); Ting-Hsiang Lee, Pingtung (TW); Guowei Zeng, Longyan (CN); Changqing Gao, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 14/788,798

(22) Filed: Jul. 1, 2015

(65) Prior Publication Data

US 2016/0007438 A1    Jan. 7, 2016

(30) Foreign Application Priority Data

Jul. 3, 2014    (CN) .......................... 2014 1 0315562

(51) Int. Cl.
*H05K 1/00* (2006.01)
*C23C 14/06* (2006.01)
*C23C 14/00* (2006.01)

(52) U.S. Cl.
CPC .......... *C23C 14/06* (2013.01); *C23C 14/0036* (2013.01); *C23C 14/0676* (2013.01)

(58) Field of Classification Search
CPC .......... H05K 1/0274; G02B 1/10; G02B 1/11; G02B 27/28

USPC ...... 174/268; 359/485.01, 580, 586; 349/15, 349/139, 200; 428/216, 312.6, 313.9, 428/332, 336, 448

See application file for complete search history.

(56) References Cited

U.S. PATENT DOCUMENTS

| | | | | |
|---|---|---|---|---|
| 4,977,569 A | * | 12/1990 | Furukawa | ............. H01S 5/4031 372/45.01 |
| 5,175,788 A | * | 12/1992 | Miura | .................. G02B 6/1221 385/124 |
| 9,018,652 B2 | * | 4/2015 | Jeong | ...................... H01L 33/32 257/94 |
| 2007/0085215 A1 | * | 4/2007 | Budd | ....................... G02B 6/43 257/778 |
| 2008/0088932 A1 | * | 4/2008 | Cho | ....................... G02B 1/113 359/586 |
| 2008/0310019 A1 | * | 12/2008 | Um | ......................... B32B 7/02 359/485.01 |

(Continued)

*Primary Examiner* — Xiaoliang Chen
(74) *Attorney, Agent, or Firm* — Cooper Legal Group LLC

(57) ABSTRACT

A substrate structure with invisible inner electrode patterns is provided. The substrate structure includes a substrate, an electrode pattern, a first laminated structure, and a passivation layer. The electrode pattern is disposed on the substrate. The first laminated structure is disposed on the electrode pattern, in which the first laminated structure includes a first upper layer, a second upper layer, and a third upper layer. The first upper layer is adjoined to the electrode pattern and the substrate. The first upper layer, the second upper layer, and the third upper layer are stacked sequentially. The passivation layer is disposed on the first laminated structure. The refractive indexes of the electrode pattern, the first upper layer, the second upper layer, the third upper layer, and the passivation layer are decreased sequentially.

10 Claims, 7 Drawing Sheets

(56) References Cited

U.S. PATENT DOCUMENTS

| | | | |
|---|---|---|---|
| 2009/0091835 A1* | 4/2009 | Wakizaka | G02B 1/115 359/586 |
| 2010/0289939 A1* | 11/2010 | Ogino | G02B 1/11 348/340 |
| 2015/0072124 A1* | 3/2015 | Sakaguchi | G02F 1/1335 428/216 |

* cited by examiner

SUBSTRATE STRUCTURE AND FABRICATION METHOD THEREOF

BACKGROUND OF THE INVENTION

This application claims priority to China Application Serial Number 201410315562.5, filed Jul. 3, 2014, which is herein incorporated by reference.

BACKGROUND OF THE INVENTION

Technical Field

The disclosure relates to the field of touch technology. More particularly, the disclosure relates to substrate structures for touch panels.

Description of Related Art

With the development of touch technology, transparent electrodes are often applied in various different types of touch panels. The transparent electrodes can be disposed as various conductive patterns with the touch panels. Ideally, the transparent electrodes have a high transmittance, and do not influence the visual effect as a result of the disposition of the conductive patterns. However, due to the difference in the refractive indexes of the transparent electrodes and the materials of upper or lower laminated layers, areas where the transparent electrodes are disposed tend to have a higher reflectance and a lower transmittance than other areas. Therefore, users can see the conductive patterns, i.e., pattern visibility is high. Those in the touch technology industry are endeavoring to improve the problem of pattern visibility and minimize the influence of the conductive patterns on the appearance of the touch panels.

SUMMARY OF THE INVENTION

Therefore, to deal with the above issue, multiple layers with gradually varying refractive indexes are used in the present invention. The multiple layers are disposed between conductive patterns and upper or lower laminated layers to thereby reduce the difference between the refractive indexes of the conductive patterns and the upper or lower laminated layers. Therefore, reflectance due to the difference between the refractive indexes is reduced. Furthermore, pattern visibility is improved, and the influence of the conductive patterns on the appearance of the touch panels is minimized.

One aspect of the disclosure provides a substrate structure, including a substrate, an electrode pattern, a first laminated structure, and a passivation layer. The electrode pattern is disposed on the substrate. The first laminated structure is disposed on the electrode pattern, in which the first laminated structure includes a first upper layer, a second upper layer, and a third upper layer. The first upper layer is adjoined to the electrode pattern. The first upper layer, the second upper layer, and the third upper layer are stacked sequentially. The passivation layer is disposed on the first laminated structure. The refractive indexes of the electrode pattern, the first upper layer, the second upper layer, the third upper layer, and the passivation layer are decreased sequentially.

In one or more embodiments, the first laminated structure includes a fourth upper layer and a fifth upper layer disposed on the third upper layer. The refractive indexes of the electrode pattern, the first upper layer, the second upper layer, the third upper layer, the fourth upper layer, the fifth upper layer, and the passivation layer are decreased sequentially.

In one or more embodiments, each of the first upper layer, the second upper layer, and the third upper layer includes a first element and a second element. Each of the first upper layer, the second upper layer, and the third upper layer has a weight ratio, in which the weight ratio is the weight of the first element to the weight of the second element, and the weight ratios of the first upper layer, the second upper layer, and the third upper layer are different.

In one or more embodiments, the first element is nitrogen, and the second element is oxygen.

In one or more embodiments, the weight ratios of the first upper layer, the second upper layer, and the third upper layer are decreased sequentially.

In one or more embodiments, the first laminated structure partially contacts the substrate.

In one or more embodiments, the substrate structure further includes a second laminated structure disposed between the electrode pattern and the substrate. The second laminated structure includes a first lower layer, a second lower layer, and a third lower layer. The first lower layer, the second lower layer, and the third lower layer are stacked sequentially. The first lower layer is adjoined to the substrate. The refractive indexes of the substrate, the first lower layer, the second lower layer, the third lower layer, and the electrode pattern are increased sequentially.

In one or more embodiments, each of the first lower layer, the second lower layer, and the third lower layer includes a first element and a second element, each of the first lower layer, the second lower layer, and the third lower layer has a weight ratio. The weight ratio is the weight of the first element to the weight of the second element, and the weight ratios of the first lower layer, the second lower layer, and the third lower layer are different.

In one or more embodiments, the first laminated structure is a transparent insulation layer.

In one or more embodiments, a thickness of the first laminated structure ranges from 30 nanometers to 150 nanometers.

Another aspect of the disclosure provides a fabrication method for a substrate structure. The fabrication method includes: placing a substrate including an electrode pattern in a reaction chamber of a sputtering station; injecting a reaction gas into the reaction chamber, in which the reaction gas includes a first gas, a second gas or a combination thereof, and the reaction gas has a gas ratio that is an amount of the first gas to the amount of the second gas; and performing a sputtering process with a target, and controlling the gas ratio or a sputtering power of the sputtering machine to form a first laminated structure on the substrate, in which the first laminated structure comprises a first upper layer, a second upper layer, and a third upper layer, and a plurality of refractive indexes of the first upper layer, the second upper layer, and the third upper layer are decreased sequentially in a direction away from the substrate.

In one or more embodiments, the fabrication method includes forming a passivation layer on the third upper layer, in which a plurality of refractive indexes of the electrode pattern, the first upper layer, the second upper layer, the third upper layer, and the passivation layer are decreased sequentially.

In one or more embodiments, the sputtering process includes: maintaining the sputtering power and controlling the gas ratio to be a first value to form the first upper layer on the substrate; adjusting the gas ratio to be a second value to form the second upper layer on the first upper layer; and adjusting the gas ratio to be a third value to form the third upper layer on the second upper layer.

In one or more embodiments, the first gas is nitrogen, and the second gas is oxygen.

In one or more embodiments, the first value is larger than the second value, and the second value is larger than the third value.

In one or more embodiments, the sputtering process includes: maintaining the gas ratio and controlling the sputtering power to be a first power to form the first upper layer on the substrate; adjusting the sputtering power to be a second power to form the second upper layer on the first upper layer; and adjusting the sputtering power to be a third power to form the third upper layer on the second upper layer.

In one or more embodiments, the first power is larger than the second power, and the second power is larger than the third power.

In one or more embodiments, the target is made of silicon.

BRIEF DESCRIPTION OF THE DRAWINGS

The invention can be more fully understood by reading the following detailed description of the embodiments, with reference made to the accompanying drawings as follows.

DETAILED DESCRIPTION OF THE INVENTION

Figure 1:
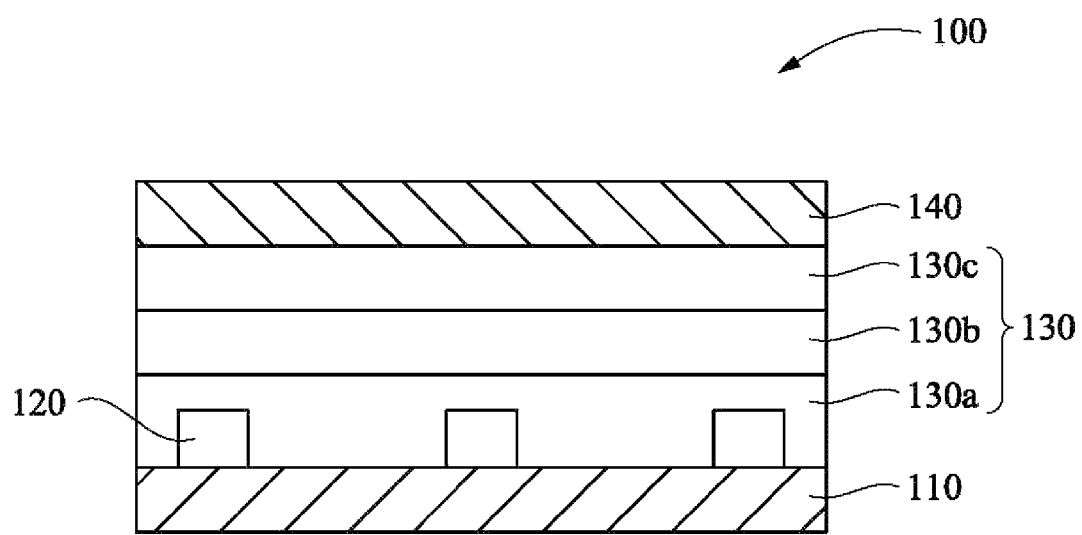
FIG. 1 is a cross-sectional view of a substrate structure according to one embodiment.

Reference will now be made in detail to the embodiments, examples of which are illustrated in the accompanying drawings. Wherever possible, the same reference numbers are used in the drawings and the description to refer to the same or like parts.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

FIG. 1 is a cross-sectional view of a substrate structure 100 according to various embodiments. The substrate structure 100 includes a substrate 110, an electrode pattern 120, a first laminated structure 130, and a passivation layer 140. The substrate 110 is ideally a transparent substrate, and it can be a rigid transparent substrate or a flexible substrate in detail. The materials of the substrate 110 can be chosen from glass, acrylic (PMMA), polyvinylchloride (PVC), polypropene (PP), polyethylene terephthalate (PET), polyethylene naphthalate (PEN), polycarbonate (PC), polystyrene (PS), and other transparent materials. The electrode pattern 120 is disposed on the substrate 110. The electrode pattern 120 is ideally a transparent electrode. The electrode pattern 120 can be made using various transparent and conductive materials, such as indium tin oxide (ITO), indium zinc oxide (IZO), cadmium tin oxide (CTO), or aluminum-doped zinc oxide (AZO). The electrode pattern 120 may be disposed in various particular configurations. The first laminated structure 130 is disposed on the electrode pattern 120 and the substrate 110. The passivation layer 140 is disposed on the first laminated structure 130.

Figure 2A:
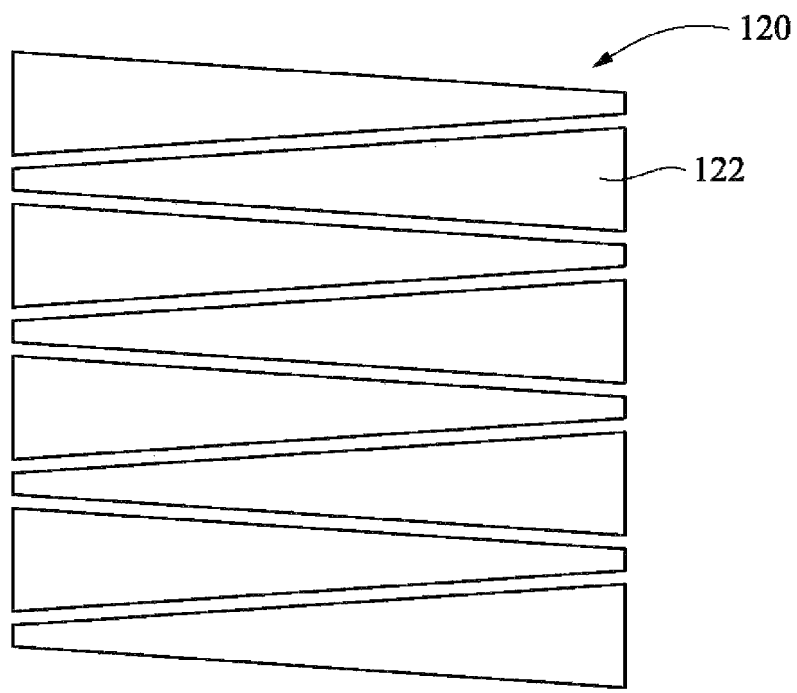
FIG. 2A to 2C are top views of an electrode pattern according to various embodiments.
Figure 2B:
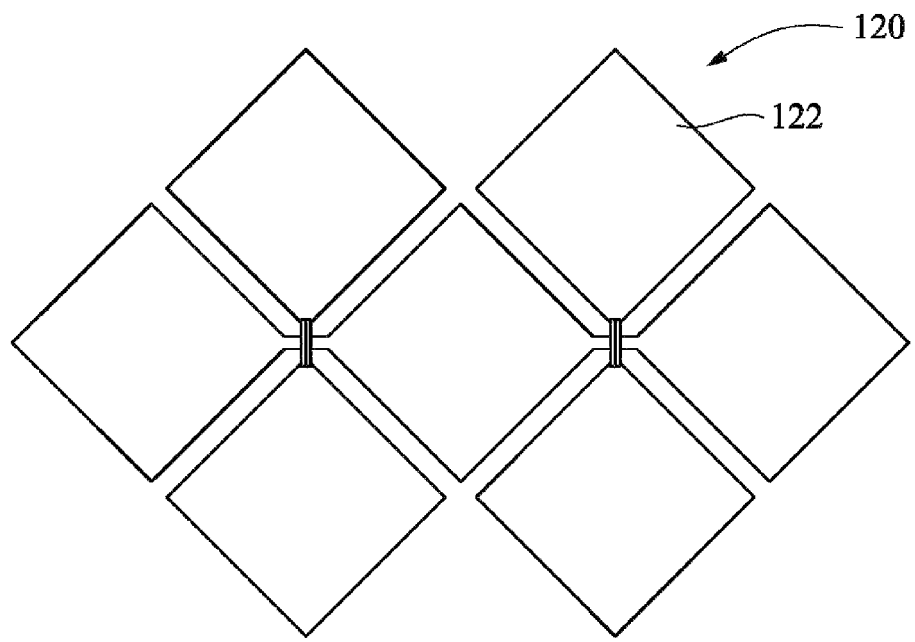
Figure 2C:
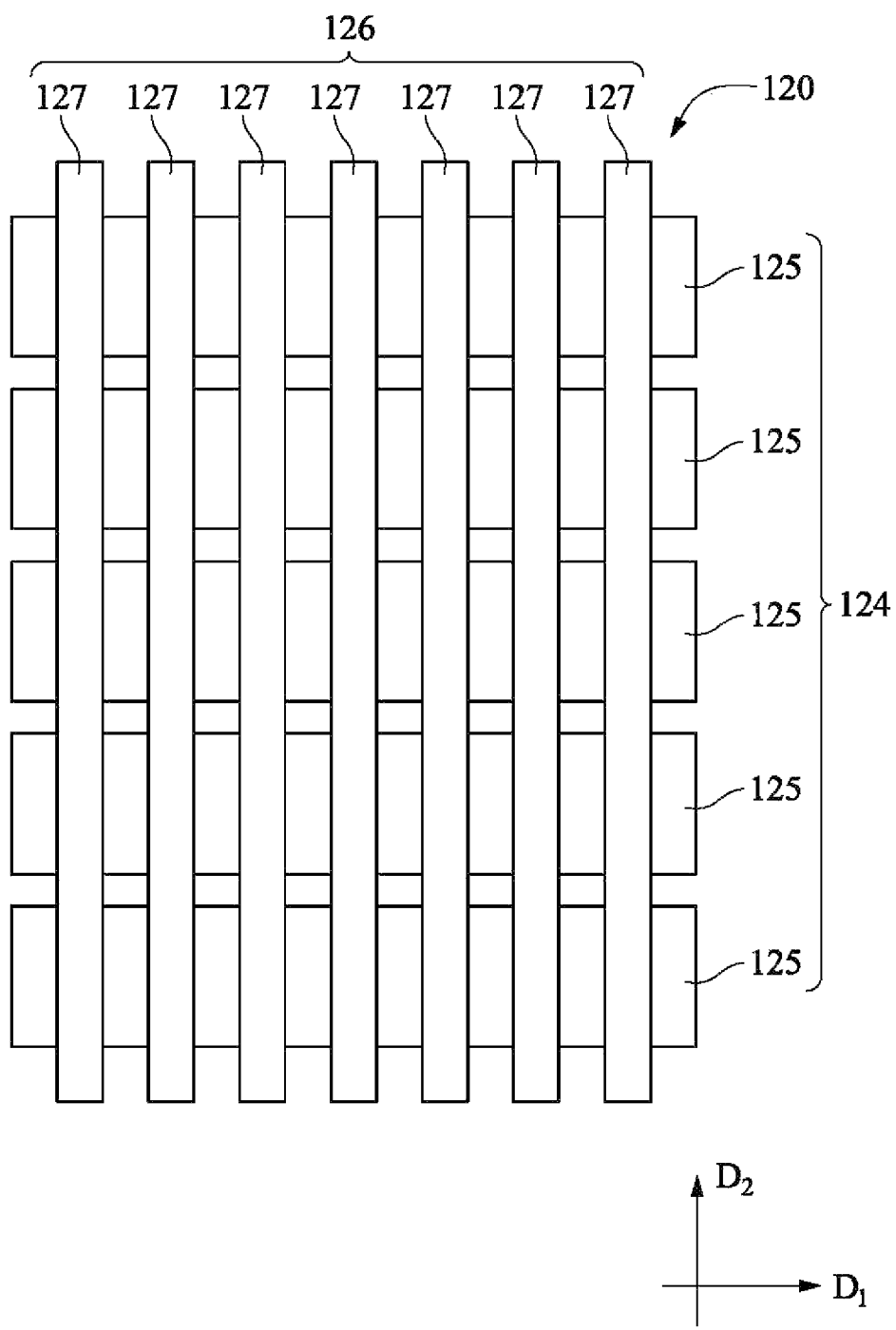

Regarding the configurations of the electrode pattern 120, FIG. 2A to 2C are top views of the electrode pattern 120 according to various embodiments. The electrode pattern 120 can be a single-layer electrode or a double-layer electrode. The electrode pattern 120 can be a single-layer electrode and have staggered electrode rows 122. The electrode rows 122 can be disposed having a rectangular shape, wedge shape (FIG. 2A), diamond shape (FIG. 2B), undulating shape, etc., so that a touch sensing function can be performed at various spots of the substrate 110.

Referring to FIG. 2C, the electrode pattern 120 can be a double-layer electrode, in which the electrode pattern 120 includes a first electrode layer 124 and a second electrode layer 126, wherein the first electrode layer 124 and the second electrode layer 126 are electrically isolated. The first electrode layer 124 includes plural first electrode rows 125 each arranged along a first direction D1, and the second electrode layer 126 includes plural second electrode rows 127 each arranged along a second direction D2. In some embodiments, the first direction D1 is perpendicular to the second direction D2. Through such a configuration of the electrode patterns 120, the touch sensing function can be performed at various spots of the substrate 110.

Reference is now made back to FIG. 1. The electrode pattern 120 does not cover the substrate 110 totally, and thus, a part of the substrate 110 is exposed by the electrode pattern 120, and part of the first laminated structure 130 contacts the substrate 110 directly.

The first laminated structure 130 is a multi-layer structure, and preferably, the first laminated structure 130 includes at least three layers. In some embodiments, the first laminated structure 130 includes a first upper layer 130a, a second upper layer 130b, and a third upper layer 130c. The first upper layer 130a, the second upper layer 130b, and the third upper layer 130c have different refractive indexes.

The first upper layer 130a is adjoined to the electrode pattern 120. The first upper layer 130a, the second upper layer 130b, and the third upper layer 130c are stacked sequentially. In some embodiments, the refractive indexes of the electrode pattern 120, the first upper layer 130a, the second upper layer 130b, the third upper layer 130c, and the passivation layer 140 are decreased sequentially.

To be specific, in one or more embodiments, the refractive index of the third upper layer 130c adjoined to the passivation layer 140 is close to the refractive index of the passivation layer 140, and the refractive index of the first upper layer 130a adjoined to the electrode pattern 120 is close to the refractive index of the electrode pattern 120.

In one or more embodiments, each of the first upper layer 130a, the second upper layer 130b, and the third upper layer 130c includes a first element and a second element. A compound made from the first element and that made from the second element have different refractive indexes. Moreover, each of the first upper layer 130a, the second upper layer 130b, and the third upper layer 130c has a weight ratio, in which the weight ratio is the weight of the first element to the weight of the second element. The weight ratios of the first upper layer 130a, the second upper layer 130b, and the third upper layer 130c are different, so that the contents of the first element and the second element are different. That is, the first upper layer 130a, the second upper layer 130b, and the third upper layer 130c have different amounts of the compounds made from the first element and the second element. Since the compounds made from the first element and the second element have different refractive indexes, the first upper layer 130a, the second upper layer 130b, and the third upper layer 130c have different refractive indexes.

For example, in one or more embodiments, layers are formed by the sputtering process through a silicon target (a target made of silicon) under a combination of oxygen and nitrogen. The first element of the layers is nitrogen, and the second element of the layers is oxygen. Nitrogen and silicon can form silicon nitrides; oxygen and silicon can form silicon oxides; and nitrogen, oxygen and silicon can form silicon oxynitrides. The refractive index of the silicon nitrides is about 2.05 to 2.2 or 2.2 to 2.3. The refractive index of the silicon oxides is about 1.4 to 1.5 or 1.45. The refractive index of the silicon oxynitrides is about 1.45 to 2.05. The first upper layer 130a, the second upper layer 130b, and the third upper layer 130c can be obtained using compounds made from silicon, nitrogen, and oxygen with different ratios. According to the different weight ratios or the molar ratios, the first upper layer 130a, the second upper layer 130b, and the third upper layer 130c have different refractive indexes.

In some embodiments, the higher the weight ratio, the higher the content of nitrogen in the compounds, the lower the content of oxygen in the compound, and therefore the higher the refractive index. On the other hand, the lower the weight ratio, the lower the content of nitrogen in the compounds, the higher the content of oxygen in the compound, and therefore the lower the refractive index. The weight ratio can approach infinity, that is, the layer can be almost entirely made of silicon nitrides, in which case the refractive index is about 2.05 to 2.2 or 2.2 to 2.3. In contrast, the weight ratio can approach zero, in which case the refractive index is about 1.4 to 1.5 or 1.45. Regardless of the value of the weight ratio, the refractive indexes of layers are in the range of the refractive indexes of compounds made from the first element, the second element, and silicon, that is, from 1.4 to 2.3.

In one or more embodiments, the weight ratios of the first upper layer 130a, the second upper layer 130b, and the third upper layer 130c are decreased sequentially. Therefore, from the first upper layer 130a to the third upper layer 130c, since the content of the oxygen increases, and the content of the nitrogen decreases, the refractive indexes of the first upper layer 130a, the second upper layer 130b, and the third upper layer 130c are decreased gradually. In this way, the refractive index of the first upper layer 130a is greater than the refractive index of the second upper layer 130b, and the refractive index of the third upper layer 130c is less than the refractive indexes of the first upper layers 130a and the second upper layers 130b.

The refractive index of the electrode pattern 120 (for example, the refractive index of indium tin oxide is about 1.85) and the refractive index of the passivation layer 140 (the refractive index is about 1.5) are both in the range of the refractive indexes of compounds made from the first element, the second element, and silicon (that is from 1.4 to 2.3). As a result, by changing the amount of nitrogen and oxygen, that is, the weight ratio between nitrogen and oxygen, a thin film stack with a gradually varying refractive index is provided, which can be used to lower the reflectance. For example, the weight ratio of the first upper layer 130a can be designed to produce a refractive index of 1.75, the weight ratio of the second upper layer 130b can be designed to produce a refractive index of 1.67, and the weight ratio of the third upper layer 130c can be designed to produce a refractive index of 1.6.

During normal incidence, the reflectance is described as a square of the difference of the refractive indexes of two adjoining mediums divided by the sum of the two adjoining mediums. Therefore, through use of the multi-layer structure with a gradually varying refractive index, the difference of the refractive indexes of two adjoining mediums is decreased, and reflectance is reduced effectively.

In one or more embodiments, the thickness of the first laminated structure 130 ranges from 30 nanometers to 150 nanometers. The thickness of the first laminated structure 130 is preferably larger than 70 nanometers. The thickness of the first laminated structure 130 discussed herein does not include the part of the first laminated structure 130 contacting the substrate 110 (that is, the thickness of the conductive pattern 120). The thickness of the first upper layer 130a, the second upper layer 130b, and the third upper layer 130c can be the same, or different.

In one or more embodiments, the first laminated structure 130 is made from transparent insulating materials. Therefore, the electrical properties of the electrode pattern 120 do not change under the influence of the first laminated structure 130, and the transmittance does not decrease due to the absorption or scattering of the first laminated structure 130.

Figure 3:
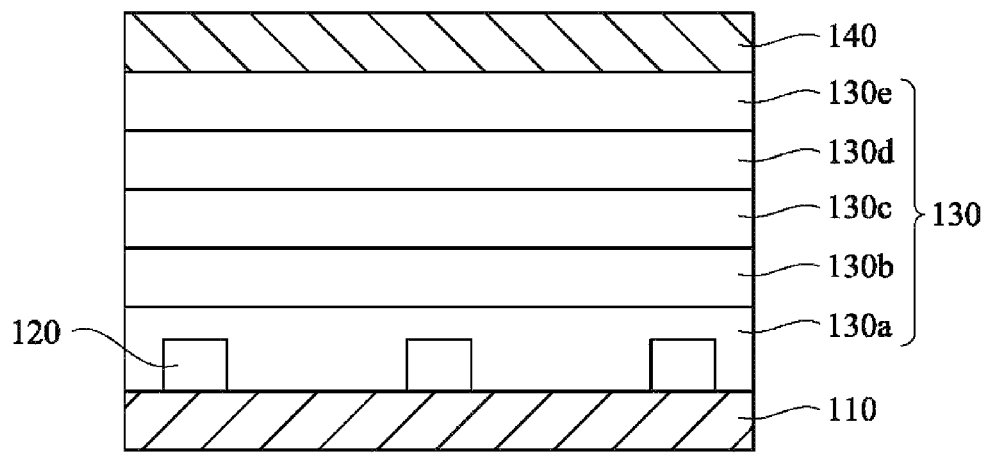
FIG. 3 is a cross-sectional view of a substrate structure according to another embodiment.

FIG. 3 is a cross-sectional view of a substrate structure 100 according to some embodiments. The embodiments are similar to the embodiments of FIG. 1, and the difference is that the substrate structure 100 of the present embodiments include a fourth upper layer 130d and a fifth upper layer 130e.

As in the previous configuration of the first upper layer 130a, the second upper layer 130b, and the third upper layer 130c, each of the fourth upper layer 130d and the fifth upper layer 130e also includes a first element and a second element. The fourth upper layer 130d and the fifth upper layer 130e also have weight ratios, which are different from the weight ratios of the first upper layer 130a, the second upper layer 130b, and the third upper layer 130c. Thus, the first upper layer 130a, the second upper layer 130b, the third upper layer 130c, fourth upper layer 130d, and the fifth upper layer 130e have different refractive indexes. The refractive indexes of the electrode pattern 120, the first upper layer 130a, the second upper layer 130b, the third upper layer 130c, the fourth upper layer 130d, the fifth upper layer 130e, and the passivation layer 140 are decreased sequentially. As a result, a thin film stack structure with a gradually varying refractive index is produced.

An example is provided in which the material of the electrode pattern 120 is indium tin oxide. Since the refractive index of the electrode pattern 120 is about 1.85 and the refractive index of the passivation layer 140 is about 1.5, the weight ratio of the first upper layer 130a can be designed to produce a refractive index of 1.75, and the weight ratio of the fifth upper layer 130e can be designed to produce a refractive index of 1.55. The weight ratios of the second upper layer 130b, the third upper layer 130c, and the fourth upper layer 130d can be designed to produce refractive indexes of 1.7, 1.65, and 1.6, respectively. Therefore, the refractive indexes of the first upper layer 130a to fifth upper layer 130e are decreased.

During normal incidence, the reflectance is described as a square of the difference of the refractive indexes of two adjoining mediums divided by the sum of the adjoining mediums. Therefore, through use of the multi-layer structure with a gradually varying refractive index, the difference of the refractive indexes of two adjoining mediums is decreased, and reflectance is reduced effectively. In some embodiments, the difference of the refractive indexes of two adjoining mediums is lower than that in the embodiments of FIG. 1, and thus it is expected that these embodiments can lower the reflectance more effectively.

In one or more embodiments, the first laminated structure 130 includes at least three layers. The number of the layers should not be limited to the previous embodiments, and in some embodiments, the number of the layers can be more than five.

Figure 4:
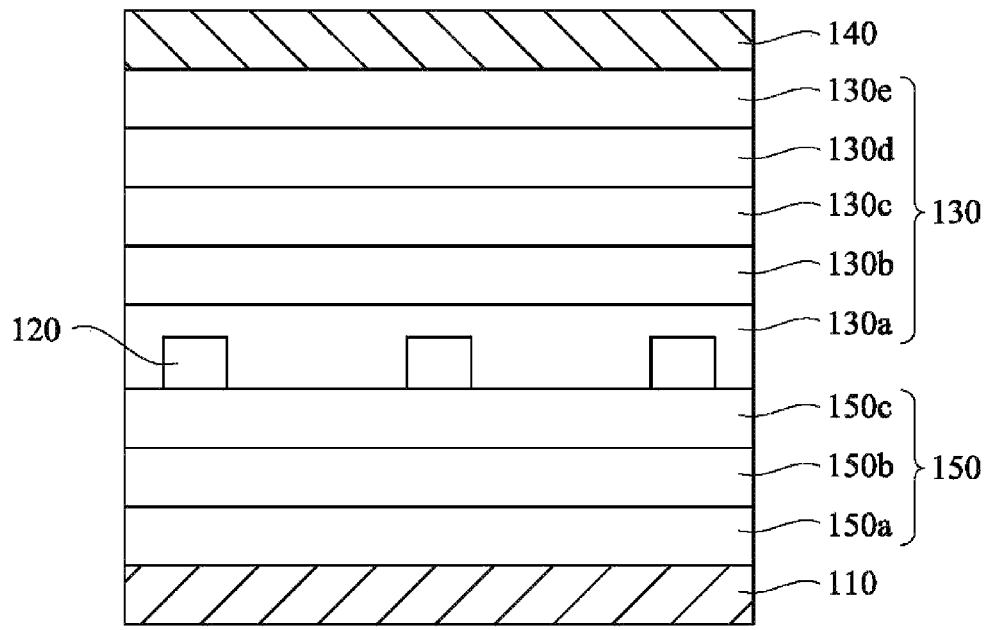
FIG. 4 is a cross-sectional view of a substrate structure according to another embodiment.

FIG. 4 is a cross-sectional view of a substrate structure 100 according to some other embodiments. These embodiments are similar to the embodiments of FIG. 3, and the difference is that the substrate structure 100 of the present embodiments includes a second laminated structure 150. The second laminated structure 150 is disposed between the electrode pattern 120 and the substrate 110. As with the configuration of the first laminated structure 130, the second laminated structure 150 includes a first lower layer 150a, a second lower layer 150b, and a third lower layer 150c. The first lower layer 150a, the second lower layer 150b, and the third lower layer 150c have different refractive indexes. The first lower layer 150a, the second lower layer 150b, and the third lower layer 150c are stacked sequentially. The refractive indexes of the first lower layer 150a, the second lower layer 150b, and the third lower layer 150c are increased progressively starting from the first lower layer 150a, which is adjacent to the substrate 110, to the third lower layer 150c, which is farthest from the substrate 110. That is, the refractive index of the first lower layer 150a is lower than the refractive index of the second lower layer 150b, and the refractive index of the second lower layer 150b is lower than the refractive index of the third lower layer 150c. The number of the layers of the second laminated structure 150 described and shown herein is given for illustrative purposes, and should not limit the scope of the disclosure.

In one or more embodiments, the first lower layer 150a is adjoined to the substrate 110. The third lower layer 150c is adjoined to the electrode pattern 120. The refractive index of the first lower layer 150a is close to the refractive index of the substrate 110. The refractive index of the third lower layer 150c is close to the refractive index of the electrode pattern 120. The refractive indexes of the substrate 110, the first lower layer 150a, the second lower layer 150b, the third lower layer 150c, and the electrode pattern 120 are increased sequentially.

As with the previous configuration of the first upper layer 130a, the second upper layer 130b, and the third upper layer 130c, each of the first lower layer 150a, the second lower layer 150b, and the third lower layer 150c includes a first element and a second element. Each of the first lower layer 150a, the second lower layer 150b, and the third lower layer 150c has a weight ratio. The weight ratio is the weight of the first element to the weight of the second element. The weight ratios of the first lower layer 150a, the second lower layer 150b, and the third lower layer 150c are different. Since the compounds made from the first element, the second element, and silicon have different refractive indexes, the first lower layer 150a, the second lower layer 150b, and the third lower layer 150c with different weight ratios have different refractive indexes.

For example, in one or more embodiments, the layers are formed by a sputtering process through a silicon target (a target made of silicon) under a combination of oxygen and nitrogen. The first element of the layer is nitrogen, and the second element of the layer is oxygen. As with the previous configuration of the first laminated structure 130, the first lower layer 150a, the second lower layer 150b, and the third lower layer 150c of the second laminated structure 150 can be made of compounds made from silicon, nitrogen, and oxygen with different ratios. According to the different weight ratios or the molar ratios, the first lower layer 150a, the second lower layer 150b, and the third lower layer 150c have different refractive indexes.

In some embodiments, the higher the weight ratio, the higher the content of nitrogen in the compound, the lower the content of oxygen in the compound, and therefore the higher the refractive index. On the other hand, the lower the weight ratio, the lower the content of nitrogen in the compound, the higher the content of oxygen in the compound, and therefore the lower the refractive index. The weight ratio can approach infinity, or alternatively, can approach zero. Regardless of the value of the weight ratio, the refractive indexes of layers are in the range of the refractive indexes of compounds made from the first element, the second element, and silicon, that is, from 1.4 to 2.3.

In one or more embodiments, the weight ratios of the first lower layer 150a, the second lower layer 150b, and the third lower layer 150c are increased progressively from the first lower layer 150a, which is adjacent to the substrate 110, to the third lower layer 150c, which is adjacent to the electrode pattern 120. In other words, the weight ratios of the first lower layer 150a, the second lower layer 150b, and the third lower layer 150c are increased sequentially, such that that the refractive indexes of the first lower layer 150a, the second lower layer 150b are increased gradually to thereby produce a thin film stack with a gradually varying refractive index.

In some embodiments, the material of the electrode pattern 120 is indium tin oxide. The refractive index of the electrode pattern 120 is about 1.85 and the refractive index of the substrate 110 is about 1.5. Both of the refractive indexes are in the range of the refractive indexes of the compounds made from silicon, nitrogen, and oxygen (that is, 1.4~2.3). Therefore, by changing the amount of nitrogen and oxygen, a thin film stack with a gradually varying refractive index can be provided. For example, the weight ratio of the first lower layer 150a can be designed to produce a refractive index of 1.6, the weight ratio of the second lower layer 150b can be designed to produce a refractive index of 1.7, and the weight ratio of the third lower layer 150c can be designed to produce a refractive index of 1.8. As a result, the refractive indexes are increased sequentially from the first lower layer 150a to the third lower layer 150c.

In some embodiments, adding the second laminated structure 150 reduces the difference between the substrate 110 and the electrode pattern 120. Therefore, reflectance is decreased, transmittance is increased, and visual perception of the electrode pattern 120 is prevented.

FIG. 5A to 5G are schematic views of a fabrication method for a substrate structure according to various embodiments.

Figure 5A:
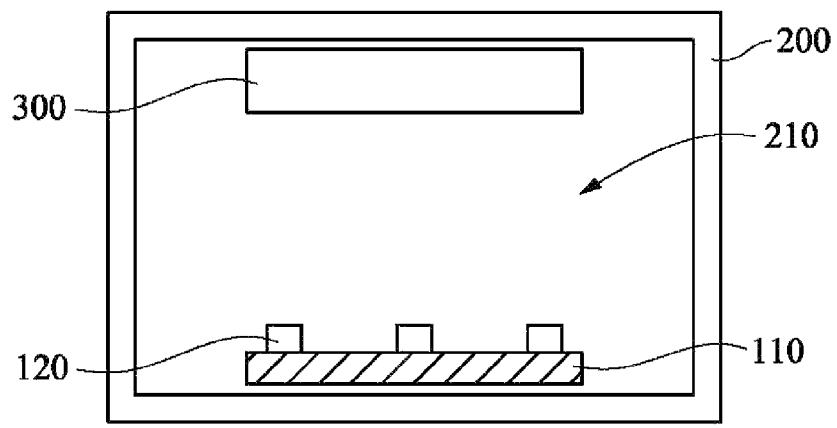
FIG. 5A to 5G are schematic views of a fabrication method for a substrate structure according to an embodiment.

Referring to FIG. 5A, a substrate 110 including an electrode pattern 120 is placed in a reaction chamber 210 of a sputtering station 200.

Next, a reaction gas is injected into the reaction chamber 210, wherein the reaction gas includes a first gas and a second gas. For example, the first gas is nitrogen, and the second gas is oxygen. The reaction gas has a gas ratio, which refers to the number of moles of the first gas to the number of moles of the second gas in a certain volume.

Figure 5B:
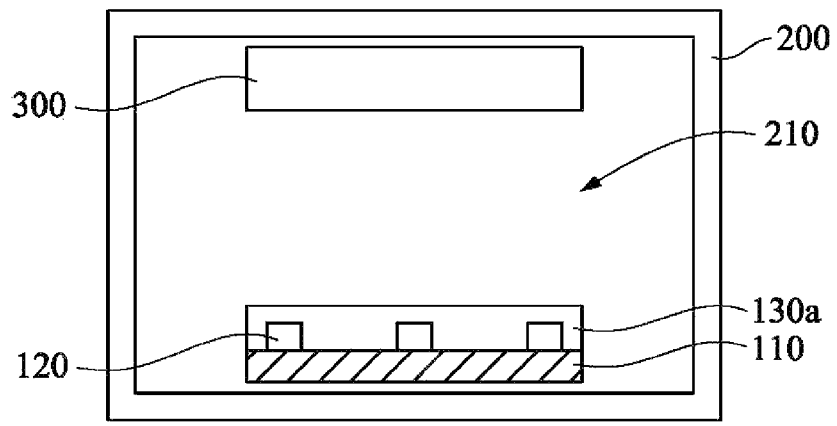

Subsequently, referring to FIG. 5B, a sputtering process is performed with a target 300, and the first gas and the second gas are affected by the sputtering process with the target 300 to thereby produce compounds after reaction. For example, the material of the target may be silicon, which reacts with the first gas and the second gas during the sputtering process to produce silicon oxy nitrides.

The compounds form a first upper layer 130a on the substrate 110 and the electrode pattern 120, in which the refractive index of the first upper layer 130a is smaller than the refractive index of the electrode pattern 120.

Figure 5C:
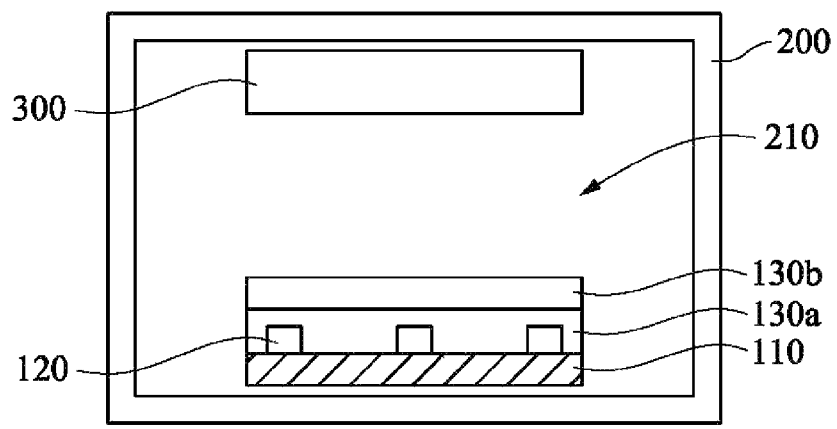

Next, referring to FIG. 5C, similarly, during the sputtering process of the target 300, compounds including the first gas and the second gas are produced, and a second upper layer 130b is formed. The second upper layer 130b is disposed on the first upper layer 130a, in which the refractive index of the second upper layer 130b is smaller than the refractive index of the first upper layer 130a.

Figure 5D:
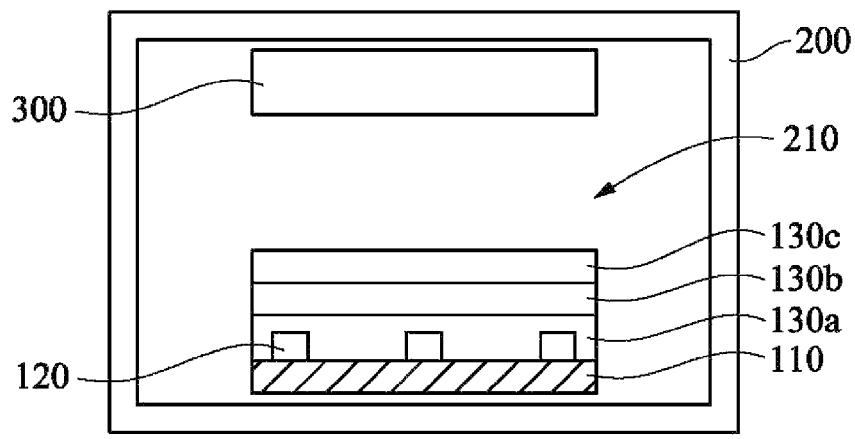

Referring to FIG. 5D, similarly, during the sputtering process of the target 300, compounds including the first gas and the second gas are produced, and a third upper layer 130c is formed on the second upper layer 130b. The refractive index of the third upper layer 130c is smaller than the refractive index of the second upper layer 130b.

Figure 5E:
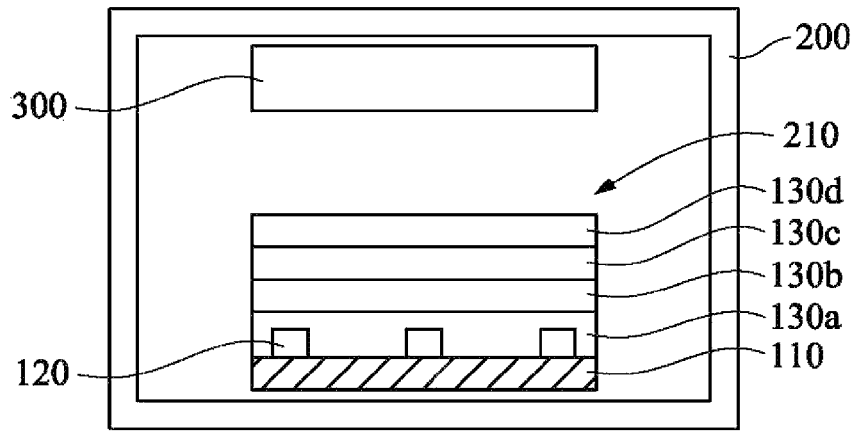

Referring to FIG. 5E, similarly, during the sputtering process of the target 300, compounds including the first gas and the second gas are produced, and a fourth upper layer 130d is formed on the third upper layer 130c. The refractive index of the fourth upper layer 130d is smaller than the refractive index of the third upper layer 130c.

Figure 5F:
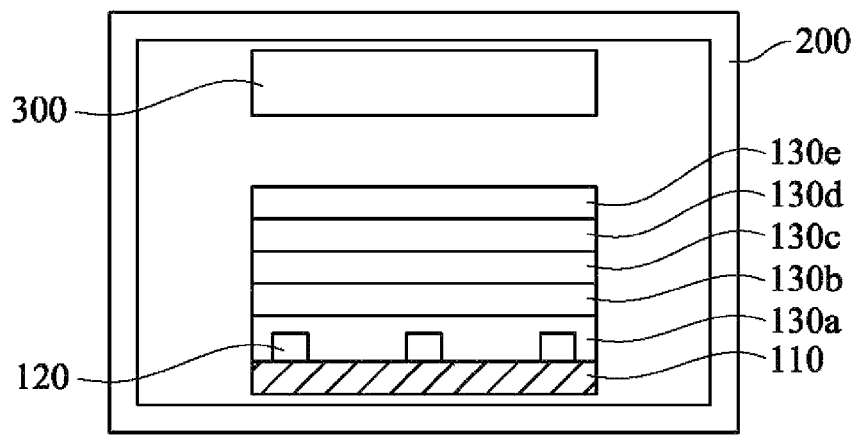

Referring to FIG. 5F, similarly, during the sputtering process of the target 300, compounds including the first gas and the second gas are produced, and a fifth upper layer 130e is formed on the fourth upper layer 130d. The refractive index of the fifth upper layer 130e is smaller than the refractive index of the fourth upper layer 130d.

Figure 5G:
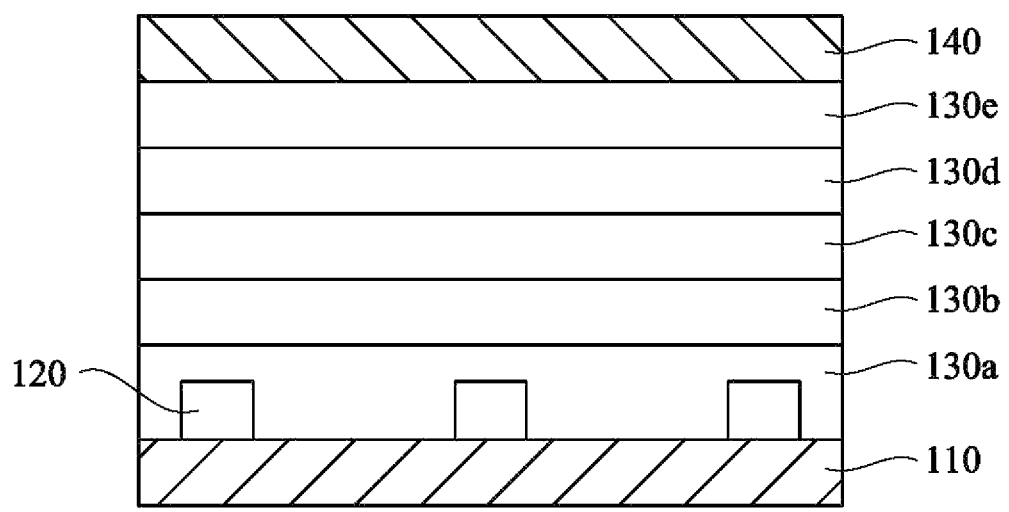

Finally, referring to FIG. 5G, a passivation layer 140 is formed on the fifth upper layer 130e. The refractive index of the passivation layer 140 is smaller than the refractive index of the fifth upper layer 130e.

In the fabrication method for a substrate structure, it should be noted that the refractive indexes of the electrode pattern 120, the first upper layer 130a, the second upper layer 130b, the third upper layer 130c, the fourth upper layer 130d, the fifth upper layer 130e, and the passivation layer 140 are decreased sequentially. There are two methods to form a stack layer with a gradually varying refractive index, and they are controlling the gas ratio and controlling the sputtering power.

First, with respect to the method of controlling the gas ratio, since the compounds come from the reactions of the target, the first gas, and the second gas, by controlling the gas ratio during the sputtering process, the content of the first element and the second element can be changed. Therefore, the refractive indexes of the layers are changed.

For example, by controlling the ratio between nitrogen and oxygen, and decreasing the gas ratio (the amount of the nitrogen to the amount of oxygen) gradually, which lowers the amount of nitrogen, the layer formed at an earlier stage (that is, the first upper layer 130a) has a larger amount of nitrogen, and the layer formed at a later stage (that is, the fifth upper layer 130e) has a smaller amount of nitrogen. Moreover, the layer formed at an earlier stage (that is, the first upper layer 130a) has a higher refractive index than the layer formed at a later stage (that is, the fifth upper layer 130e).

To be specific, the gas ratios from FIG. 5B to FIG. 5F are set as a first value, a second value, a third value, a fourth value, and a fifth value, respectively. In order to produce the first upper layer 130a, the second upper layer 130b, the third upper layer 130c, the fourth upper layer 130d, the fifth upper layer 130e with refractive indexes decreased sequentially, the sputtering power can be maintained, and the first value, the second value, the third value, the fourth value, and the fifth value may be decreased sequentially, so that a thin film stack with a gradually varying refractive index can be formed.

With respect to the method of controlling the sputtering power, this method involves forming multiple layers with different weight ratios by taking the sputtering power as a variable, in which the gas ratio can be maintained. Under different sputtering power conditions, the contents of nitrogen and oxygen in the compounds are made different. That is, the weight ratio of nitrogen and oxygen in the layers is changed by the sputtering power.

For example, in one or more embodiments, a large sputtering power allows the first element (nitrogen) to be formed more easily than the second element (oxygen). Moreover, the larger the sputtering power, the greater the amount of nitrogen in the compounds.

Therefore, to form a thin film stack with a gradually varying refractive index, lowering the sputtering power gradually during the sputtering process leads to the gradual decreasing of the amount of nitrogen in the compounds. As a result, the layer formed at an earlier stage (that is, the first upper layer 130a) has a larger amount of nitrogen, and the layer formed a later stage (that is, the fifth upper layer 130e) has a smaller amount of nitrogen. Moreover, the layer formed at an earlier stage (that is, the first upper layer 130a) has a higher refractive index than the layer formed at a later stage (that is, the fifth upper layer 130e).

To be specific, the sputtering power from FIG. 5B to FIG. 5F are a first power, a second power, a third power, a fourth power, and a fifth power, respectively. In order to produce the first upper layer 130a, the second upper layer 130b, the third upper layer 130c, the fourth upper layer 130d, the fifth upper layer 130e with the refractive indexes decreased sequentially, the gas ratio can be maintained, and the first power, the second power, the third power, the fourth power, and the fifth power are designed to decrease sequentially, so that a thin film stack with a gradually varying refractive index can be formed.

The gas ratio and the sputtering power can be controlled numerically, so ideally, the weight ratios of the first element and the second element in the layers can be controlled precisely. Hence, the ideal refractive indexes can be achieved, and a nice effect of the gradually varying refractive index can also be achieved. Though in the above illustration, either the gas ratio or the sputtering power is controlled, such a method should not limit the scope of the disclosure. By collocation of different gas ratios and sputtering powers, an effect of the gradually varying refractive index can also be achieved.

According to some embodiments, by disposing the multiple layers with gradually varying refractive indexes between the conductive patterns and the upper or lower laminated layers, reflectance due to the difference between the refractive indexes of the conductive patterns and the upper or lower laminated layers is reduced. In addition, by adjusting the gas ratio and the sputtering power, the ratios of nitrogen and oxygen in the layers are different, the difference of the refractive indexes of the adjoining layers can be very small, and a nice effect of gradually varying refractive indexes can be achieved. Therefore, the problem of pattern visibility due to high reflectance at the interfaces of an electrode pattern can be solved.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure disclosed without departing from the scope or spirit of the disclosure. In view of the foregoing, it is intended that the disclosure cover modifications and variations provided they fall within the scope of the following claims.

What is claimed is:

1. A substrate structure, comprising:
a substrate;
an electrode pattern disposed on the substrate;
a first laminated structure disposed on the electrode pattern, wherein the first laminated structure comprises a first upper layer, a second upper layer, and a third upper layer, the first upper layer is adjoined to the electrode pattern, and the first upper layer, the second upper layer, and the third upper layer are stacked sequentially; and
a passivation layer disposed on the first laminated structure, wherein the refractive indexes of the electrode pattern, the first upper layer, the second upper layer, the third upper layer, and the passivation layer are decreased sequentially.

2. The substrate structure of claim 1, wherein the first laminated structure further comprises a fourth upper layer and a fifth upper layer disposed on the third upper layer, wherein the refractive indexes of the electrode pattern, the first upper layer, the second upper layer, the third upper layer, the fourth upper layer, the fifth upper layer and the passivation layer are decreased sequentially.

3. The substrate structure of claim 1, wherein each of the first upper layer, the second upper layer, and the third upper layer comprises a first element and a second element; each of the first upper layer, the second upper layer, and the third upper layer has a weight ratio; the weight ratio is the weight of the first element to the weight of the second element; and the weight ratios of the first upper layer, the second upper layer, and the third upper layer are different.

4. The substrate structure of claim 3, wherein the first element is nitrogen, and the second element is oxygen.

5. The substrate structure of claim 4, wherein the weight ratios of the first upper layer, the second upper layer, and the third upper layer are decreased sequentially.

6. The substrate structure of claim 1, wherein the first laminated structure partially contacts the substrate.

7. The substrate structure of claim 1, further comprising a second laminated structure disposed between the electrode pattern and the substrate, wherein the second laminated structure comprises a first lower layer, a second lower layer, and a third lower layer; the first lower layer, the second lower layer, and the third lower layer are stacked sequentially; the first lower layer is adjoined to the substrate; and the refractive indexes of the substrate, the first lower layer, the second lower layer, the third lower layer, and the electrode pattern are increased sequentially.

8. The substrate structure of claim 7, wherein each of the first lower layer, the second lower layer, and the third lower layer comprises a first element and a second element; each of the first lower layer, the second lower layer, and the third lower layer has a weight ratio; the weight ratio is the weight of the first element to the weight of the second element; and the weight ratios of the first lower layer, the second lower layer, and the third lower layer are different.

9. The substrate structure of claim 1, wherein the first laminated structure is a transparent insulation layer.

10. The substrate structure of claim 1, wherein a thickness of the first laminated structure ranges from 30 nanometers to 150 nanometers.

* * * * *